United States Patent
Kwak et al.

[11] Patent Number: 5,940,730
[45] Date of Patent: Aug. 17, 1999

[54] METHOD OF FORMING A CONTACT HOLE OF A SEMICONDUCTOR DEVICE

[75] Inventors: Noh Jung Kwak; Choon Hwan Kim, both of Seoul, Rep. of Korea

[73] Assignee: Hyundai Electronics Industries Co., Ltd., Kyungki-Do, Rep. of Korea

[21] Appl. No.: 08/771,579

[22] Filed: Dec. 20, 1996

[30] Foreign Application Priority Data

Dec. 29, 1995 [KR] Rep. of Korea ............. 95-65690

[51] Int. Cl.$^6$ ............................................. H01L 21/461
[52] U.S. Cl. .................. 438/637; 438/640; 438/713
[58] Field of Search ............................ 438/637, 640, 438/673, 713, 700

[56] References Cited

U.S. PATENT DOCUMENTS

| | | |
|---|---|---|
| 4,764,245 | 8/1988 | Grewal ................................. 156/643 |
| 4,902,377 | 2/1990 | Berglund et al. . |
| 5,013,400 | 5/1991 | Kurasaki et al. . |
| 5,203,957 | 4/1993 | Yoo et al. . |
| 5,371,042 | 12/1994 | Ong . |
| 5,441,595 | 8/1995 | Yamagata et al. ......................... 44/1 |
| 5,453,403 | 9/1995 | Meng et al. . |

FOREIGN PATENT DOCUMENTS

| | | |
|---|---|---|
| 496 614 A1 | of 1992 | European Pat. Off. . |
| 63-258021 | of 1987 | Japan . |
| 2002125 | of 1988 | Japan . |
| 4-102331 | of 1990 | Japan . |
| 4-23322 | of 1990 | Japan . |

*Primary Examiner*—Caridad Everhart
*Attorney, Agent, or Firm*—Scott C. Harris, Esq.

[57] ABSTRACT

The present invention relates to a method of forming a contact hole of a semiconductor device, and discloses a method of forming a contact hole of a semiconductor device which can remove an oxide film formed on the bottom of the contact hole, and make the edge portions of the entrance to the contact hole and reduce the topology of the contact hole by performing high frequency plasma etching processes in two stage in which the condition of pressure and electric power are different.

3 Claims, 1 Drawing Sheet

METHOD OF FORMING A CONTACT HOLE OF A SEMICONDUCTOR DEVICE

BACKGROUND OF INVENTION

1. Field of the Invention

The present invention relates to a method of forming a contact hole of a semiconductor device and, more particularly, to a method of forming a contact hole of a semiconductor device that can improve characteristics of step coverage of metal and contact resistance.

2. Description of the Prior Art

In general, as the semiconductor device becomes highly integrated, the metal layers are formed as a double or multiple level structure, and size of the contact hole for contact between metal layers becomes smaller. Therefore, the characteristics of the step coverage of metal in the fine contact hole is significantly degraded, whereby there occurs problems of poor contact with the metal layer or degradation of flatness. A conventional method of forming a contact hole of a semiconductor device is described below.

In the conventional method of forming a fine contact hole of a semiconductor device, a lower metal layer and an interlayer insulating layer are sequentially formed on a silicon substrate on which an insulating layer is formed. A portion of the interlayer insulating layer is wet etched to a predetermined depth by a photograph and etching processes using a contact hole mask, and thereafter, a remaining portion of the etched portion of the interlayer insulating layer is dry etched to expose a portion of the lower metal layer. As a result, a fine contact hole is formed. Then, in order to remove an $Al_2O_3$ film formed on the surface of the exposed lower metal layer, a high frequency plasma (radio frequency plasma) etching process is performed using an Argon gas and an electric power of 500 W at a pressure of 0.5 mTorr. An upper metal layer is then formed on the entire structure by depositing a metal to bury the fine contact hole. However, the step coverage of the metal becomes poor due to the sharp edge of entrance to the fine contact hole and the high topology so that the contact resistance between the upper and lower metal layers is increased.

SUMMARY OF THE INVENTION

Therefore, an object of the present invention is to provide a method of forming a contact hole of a semiconductor device that can remove an $Al_2O_3$ film formed on the surface of the exposed metal layer and reduce the topology of the contact hole by performing high frequency plasma etching processes in two stage.

The present invention to accomplish the above described object is characterized in that it comprises the steps of: sequentially forming a metal layer and an interlayer insulating layer on a silicon substrate on which an insulating layer is formed; isotropically etching a portion of the interlayer insulating layer to a predetermined depth using a contact hole mask; anisotropically etching the remaining thickness of the interlayer insulating layer to form a contact hole for exposing a portion of the metal layer; performing a first plasma etching process using low electric power at high pressure to make the edge portions of the entrance to the contact hole to be round and to reduce the topology of the contact hole; and performing a second plasma etching process using a high electric power at low pressure to reduce the topology of the contact hole and to remove $Al_2O_3$ film formed on the surface of the exposed metal layer in the contact hole.

BRIEF DESCRIPTION OF THE DRAWINGS

For fuller understanding of the nature and objects of the present invention, reference should be had to the following detailed description taken in conjunction with the accompanying drawings in which.

DETAILED DESCRIPTION OF THE INVENTION

The present invention will be described below in detail with reference to the accompanying drawings.

Figure 1A:
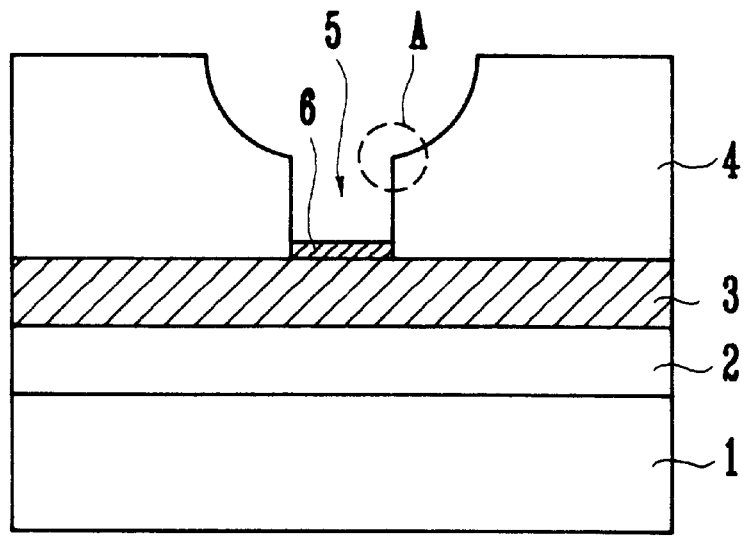
FIGS. 1A through 1C are sectional view of a device to illustrate a method of forming a contact hole of a semiconductor device according to the present invention.

Referring to FIG. 1A, an insulating layer 2, a metal layer 3 and an interlayer insulating layer 4 are sequentially formed on a silicon substrate 1. A portion of the interlayer insulating layer 4 is etched by a photography and etching process using a contact hole mask, thus a contact hole 5 for exposing a portion of the metal layer 3 is formed.

In general, the etching process for forming a contact hole can be done by either applying an anisotropic etching process or by applying both an isotropic etching process and an anisotropic etching process. The present invention is a case of forming the contact hole 5 by applying both the isotropic and anisotropic etching processes.

The contact hole 5, for exposing a portion of the metal layer 3, is formed by first etching the interlayer insulating layer 4 to a predetermined depth by an isotropic etching process and second etching the remaining thickness of the interlayer insulating layer 4 by an anisotropic etching process. An $Al_2O_3$ film 6 is formed on the surface of the exposed metal layer 3 in the contact hole 5, and the edge portions A of the entrance to the contact hole 5 are sharply formed. The $Al_2O_3$ film 6 increases the contact resistance and the edge portions A worsen the characteristics of step coverage of the metal in a metal deposition process.

Figure 1B:
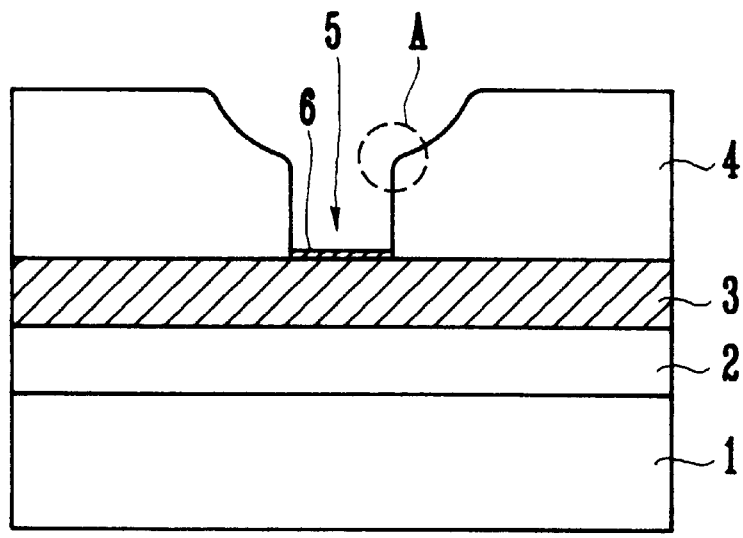
Figure 1C:
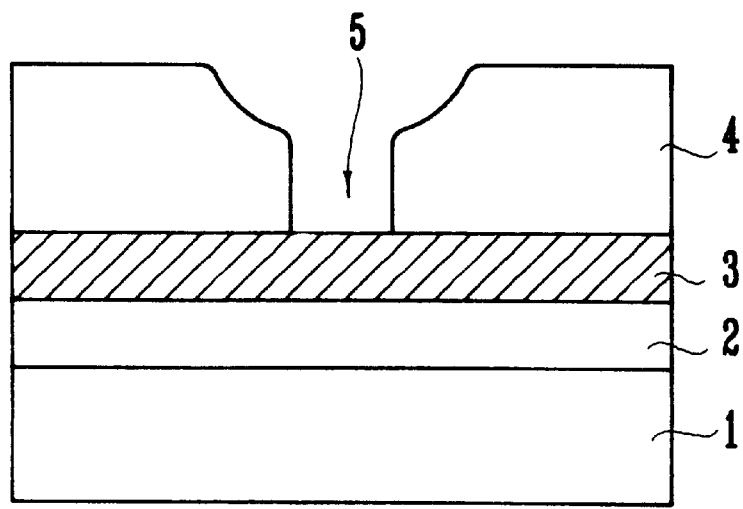

FIG. 1B shows a condition in which a first high frequency plasma etching process is performed and FIG. 1C shows a condition is which a second high frequency plasma etching process is performed.

The first high frequency plasma etching process is performed using a low electric power of 200 to 400 W at high pressure of 3 to 7 mTorr, and the second high frequency plasma etching process is performed using a high electric power of 400 to 600 W at low pressure of 0.3 to 0.7 mTorr. The gas used in the first and second high frequency plasma etching processes is an inert gas, for example, Argon gas. Since the vertical mobility of plasma ion is reduced at the high pressure and low electric power, the upper end of the interlayer insulating layer 4 is not only etched, but also the inner sides of the interlayer insulating layer 4, consisting the side wall of the contact hole 5, are etched.

Therefore, as shown in FIG. 1B, the sharp edge portions A of the entrance to the contact hole 5 are rounded off by the first high frequency plasma etching process performed using a low electric power at a high pressure. The vertical mobility of the plasma ion is increased at the low pressure and high electric power, therefore, as shown in FIG. 1C, the $Al_2O_3$ film 6 formed on the exposed metal layer 3 is removed by the second high frequency plasma etching process performed using a high electric power at a low pressure.

On the other hand, the upper portion of the interlayer insulating layer 4 is also etched to a predetermined thickness during the first and second high frequency plasma etching processes, thus it is possible to obtain an effect that the topology of the contact hole 5 is reduced.

The plasma etching equipment used for the present invention is able to remove the $Al_2O_3$ film and then deposit the metal by an in-situ process. The high frequency (RF) plasma chamber is constructed to use two frequencies. The first frequency is 13.56 MHz and serves to etch the $Al_2O_3$ film, and the second frequency is 400 KHz and serves to increase the concentration of the plasma. By properly adjusting the electric power having the first and second frequencies, and at the same time adjusting the pressure of Argon gas, the $Al_2O_3$ film can be removed and the shape of entrance to the contact hole can be changed to be advantageous in burying the contact hole.

As described above, according to the present invention, the $Al_2O_3$ film formed on the surface of the exposed metal layer in the contact hole can be removed, the edge portions of the entrance of the contact hole can be rounded off and the topology of the contact hole can be reduced by the two stage high frequency plasma etching processes. Therefore, there are excellent effects in that the step coverage of the metal in the contact hole can be improved and the contact resistance between the metal layers can be reduced so as to improve the electrical characteristics and yield of the device.

What is claimed is:

1. A method of forming a contact hole of a semiconductor device comprising:

sequentially forming a metal layer and an interlayer insulating layer on a silicon substrate on which an insulating layer is formed;

isotropically etching a portion of said interlayer insulating layer to a predetermined depth using a contact hole mask;

anisotropically etching the remaining thickness of said interlayer insulating layer to form a contact hole for exposing a portion of said metal layer;

performing a first plasma etching process using an electric power between 200 to 400 W at a pressure between 3 to 7 mTorr to make the edge portions of the entrance to said contact hole to be round and to reduce the topology of said contact hole; and performing a second plasma etching process using an electric power between 400 and 600 W at low pressure between 0.3 and 0.7 mTorr to reduce the topology of said contact hole and to remove an oxide film formed on the surface of said exposed metal layer in said contact hole.

2. A method of forming a contact hole of a semiconductor device comprising:

sequentially forming a metal layer and an interlayer insulating layer on a silicon substrate on which an insulating layer is formed;

etching a portion of said interlayer insulating layer to form a contact hole for exposing a portion of said metal layer;

performing a first plasma etching process using a electric power between 200 and 400 W at high pressure between 3 and 7 mTorr to make the edge portions of the entrance to said contact hole to be round and to reduce the topology of said contact hole; and performing a second plasma etching process using an electric power between 400 and 600 W at low pressure between 0.3 and 0.7 mTorr to reduce the topology of said contact hole and to remove an oxide film formed on the surface of said exposed metal layer in said contact hole.

3. A method of forming a contact hole of a semiconductor device comprising:

sequentially forming a metal layer and an interlayer insulating layer on a silicon substrate;

forming a contact hole for exposing a portion of said metal layer by etching a portion of said interlayer insulating layer; and performing first and second plasma etching processes, one of said first and second plasma etching processes is performed using a electric power between 200 and 400 W at a pressure between 3 and 7 mTorr and the other is performed using an electric power between 400 and 600 W at a pressure between 0.3 to 0.7 mTorr to make the edge portions of the entrance to said contact hole to be round, to reduce the topology of said contact hole and to remove an oxide film formed on the surface of said exposed metal layer in said contact hole.

* * * * *